United States Patent
Gordin et al.

(10) Patent No.: US 8,943,456 B2
(45) Date of Patent: Jan. 27, 2015

(54) LAYOUT DETERMINING FOR WIDE WIRE ON-CHIP INTERCONNECT LINES

(75) Inventors: Rachel Gordin, Hadera (IL); David Goren, Nesher (IL); Sue Ellen Strang, Burlington, VT (US); Kurt Alan Tallman, Essex Junction, VT (US); Youri V. Tretiakov, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 429 days.

(21) Appl. No.: 13/069,411

(22) Filed: Mar. 23, 2011

(65) Prior Publication Data

US 2011/0179392 A1 Jul. 21, 2011

Related U.S. Application Data

(63) Continuation-in-part of application No. 10/954,672, filed on Sep. 30, 2004, now abandoned.

(51) Int. Cl.
  *G06F 17/50* (2006.01)
  *H01L 23/528* (2006.01)
  *H01L 21/768* (2006.01)
  *H01L 23/522* (2006.01)

(52) U.S. Cl.
  CPC ........... *H01L 23/528* (2013.01); *H01L 21/7684* (2013.01); *H01L 23/5225* (2013.01); *H01L 2924/0002* (2013.01)
  USPC ............................ 716/129; 716/110; 716/126

(58) Field of Classification Search
  USPC ......................................................... 716/52
  See application file for complete search history.

(56) References Cited

U.S. PATENT DOCUMENTS

| 5,382,831 | A * | 1/1995 | Atakov et al. ................. 257/767 |
| 5,705,301 | A | 1/1998 | Garza et al. |
| 6,124,198 | A * | 9/2000 | Moslehi ....................... 438/622 |
| 6,169,326 | B1 | 1/2001 | Jun |
| 6,417,572 | B1 | 7/2002 | Chidambarrao et al. |
| 6,806,558 | B2 | 10/2004 | Apel |
| 6,961,229 | B2 | 11/2005 | Otsuka et al. |
| 2003/0141574 | A1 | 7/2003 | Yamamoto et al. |
| 2003/0174529 | A1 | 9/2003 | Forbes et al. |

FOREIGN PATENT DOCUMENTS

CN    200510070268.3    2/2008

* cited by examiner

*Primary Examiner* — Paul Dinh
*Assistant Examiner* — Bryce Aisaka

(57) ABSTRACT

A method for determining the layout of an interconnect line is provided including: providing a required width for the interconnect line; determining a layout of the interconnect line including slotting the interconnect line to provide two or more fingers extending along the interconnect line with an elongate slot separating adjacent fingers; and determining a number of elongate apertures to be arranged across the width of the interconnect line by comparing the required width with a maximal width for a solid metal feature, and a minimal elongate aperture width. The two or more fingers and elongate slot may be of constant width and equally spaced across the interconnect line width. The method may include selecting the number of fingers and the width of the slots to optimize the layout for a given layer technology.

19 Claims, 7 Drawing Sheets

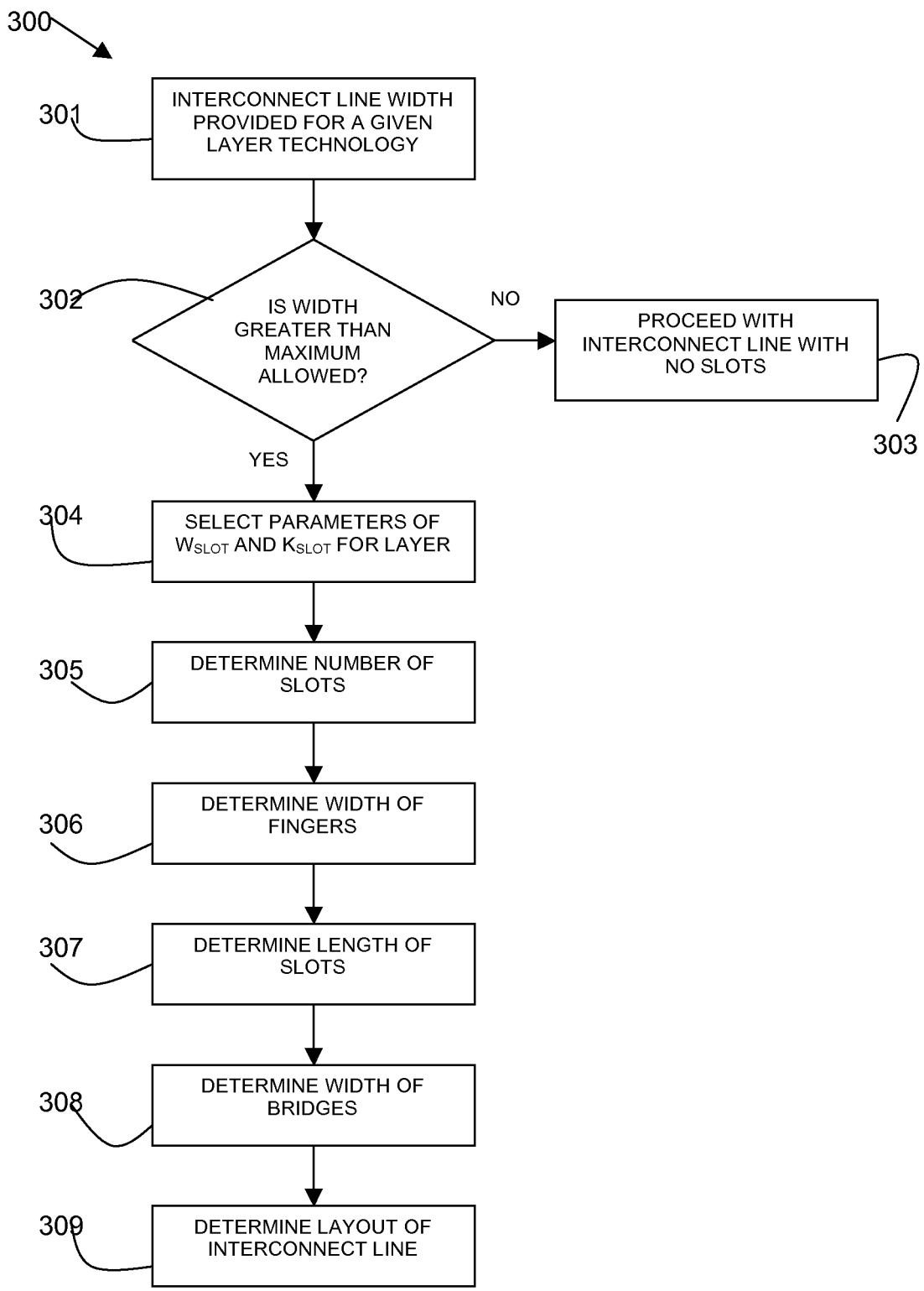

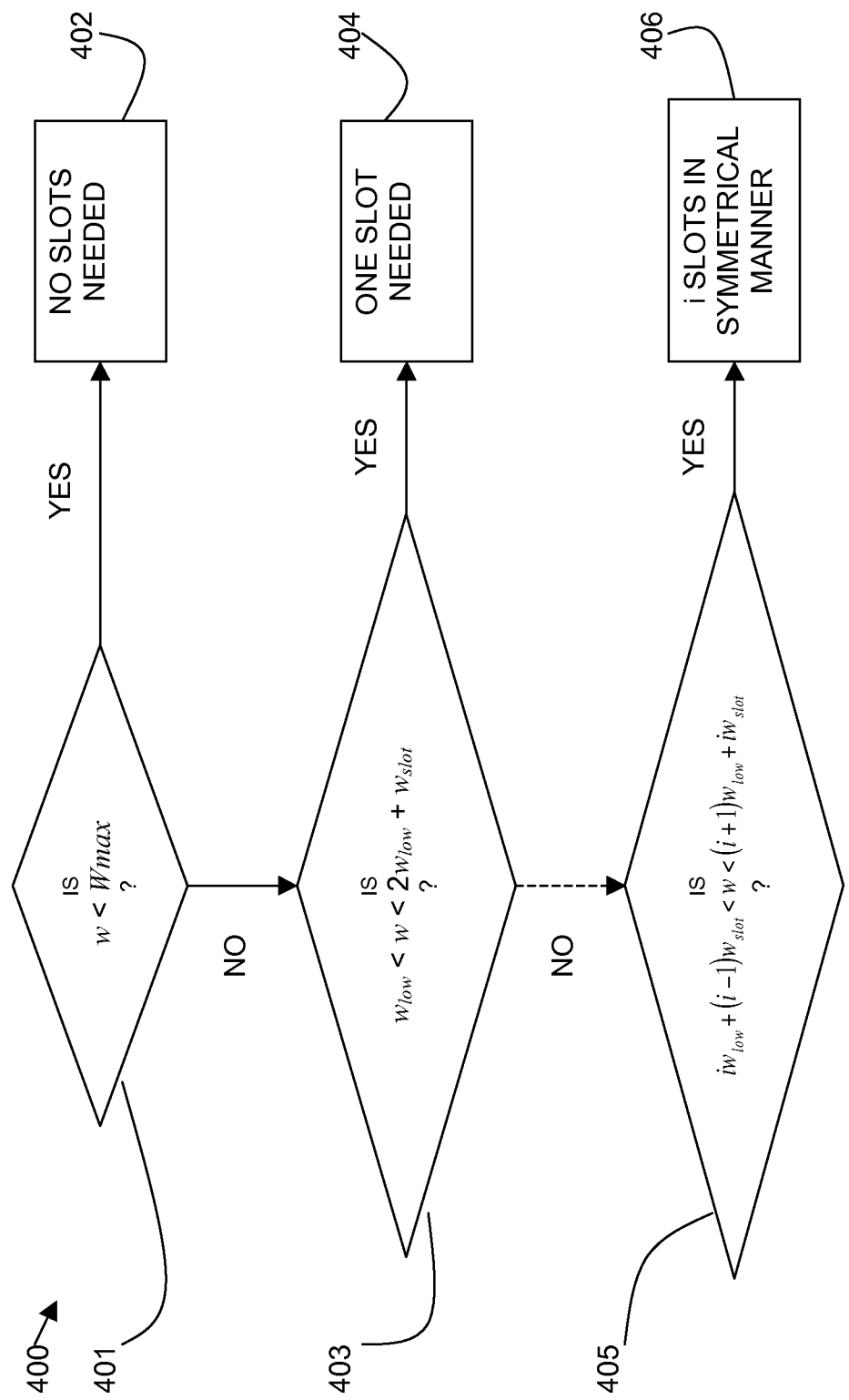

LAYOUT DETERMINING FOR WIDE WIRE ON-CHIP INTERCONNECT LINES

CROSS-REFERENCE TO RELATED APPLICATIONS

This application is a continuation-in-part of application Ser. No. 10/954,672 titled "DEVICE AND METHOD FOR REDUCING DISHING OF CRITICAL ON-CHIP INTERCONNECT LINES", filed Sep. 30, 2004, which is incorporated herein by reference.

BACKGROUND OF THE INVENTION

This invention relates to the field of the fabrication of integrated circuits. In particular, this invention relates to determining a layout for wide wire on-chip interconnect lines.

Development of integrated circuits continues to push the boundaries of miniaturization. On-chip devices are becoming smaller and more numerous which boosts performance but increases the difficulty of wiring them together. The conductivity of the metal used to interconnect the devices is increasingly important. The most commonly used material for metal interconnect lines up to several years ago has been aluminium. However, aluminium imposes limitations on minimal wire width due to high vulnerability to electromigration (the process by which a metal conductor changes shape under the influence of an electric current flowing through it and which eventually leads to the breaking of the conductor). Other metals suitable for use in interconnect lines have therefore been sought.

Copper has a significantly better resistance to electromigration than aluminium, therefore, chips using copper interconnect can have smaller metal components. In addition to this, copper is a better conductor than aluminium, so copper wires use less energy to pass electricity through them. Together, these effects lead to higher-performance processors. Copper-based processors continue to be the state of the art for the semiconductor industry today.

The relative transition from aluminium to copper required significant developments in fabrication techniques, namely, introducing the "Damascene" (or "dual-Damascene") process whose crucial stage is chemical-mechanical polishing (CMP). Applying CMP to the region of wide wires leads to excessive removal of copper ("dishing"), while in the region of large areas of dielectric excessive dielectric layer is left.

In order to prevent these unwanted effects, the percentage of copper within any area of a given size on an integrated circuit must fall within a predefined limit. This is called the copper density Physical Design Rule which is a part of Technology Physical Design Rules issued by process technology vendors per technology. For example, the copper density may be required to be within 15% and 85%. The density may be checked automatically for every 50 µm square area of an integrated circuit design. In addition to this, in order to reduce the damage caused by dishing of copper wires, the Design Rules limit maximal width of such wires.

During the design process of an integrated circuit the layout is designed using computer aided design with software tools for performing various tasks aiding the designer. Technology Physical Design Rules always include a section which defines ranges of acceptable dimensions of interconnects for given technologies. These Physical Design Rules must be adhered to, and Design Rules Check (DRC) is a computer program product that checks design compliance with the Physical Design Rules. DRC is an indispensable part of computer aided design packages.

One or more interconnect lines may be identified as critical in a given design, and while embodiments might be envisaged where all interconnect lines are treated as critical, typically only a small subset of interconnect lines in a design are critical. Critical interconnect lines can be modelled as transmission lines (also referred to as T-lines).

Transmission lines have a special geometry in that as well as lines carrying signals they have shielding lines which return current. The shielding lines may be at the side of the signal line such that the transmission line can consist of a single metal layer (coplanar waveguides) or at the bottom such that the signal line can be shielded from a lossy substrate below by means of a ground shield (microstrip lines). Both signal and ground layers can be routed using copper metal layers.

Transmission lines are implemented as electronic devices in an integrated circuit in that they have a parametric structure which can be varied by the designer according to design needs and dimensions. They can be provided as an off-the-shelf device which can be inserted into a design. On one hand, they should comply with Technology Physical Design Rules. On the other hand, in order to guarantee sufficiently low losses in critical interconnect, both signal and shielding lines should be wide, usually wider than maximum width allowed by Design Rules. The present invention suggests a solution to this contradiction.

SUMMARY OF THE INVENTION

According to a first aspect of the present invention there is provided a method for determining the layout of an interconnect line, comprising: having a required width for the interconnect line; and determining a number of elongate apertures to be arranged across the width of the interconnect line by comparing the required width with a maximal width for a solid metal feature, and a minimal elongate aperture width; wherein said steps are implemented in either: computer hardware configured to perform said providing and determining steps, or computer software embodied in a non-transitory, tangible, computer-readable storage medium.

According to a second aspect of the present invention there is provided a computer program product for determining the layout of an interconnect line, the computer program product comprising: a computer readable storage medium having computer readable program code embodied therewith, the computer readable program code comprising: computer readable program code configured to: receive a required width for an interconnect line; and determine a number of elongate apertures to be arranged across the width of the interconnect line by comparing the required width with a maximal width for a solid metal feature, and a minimal elongate aperture width.

The described structure has carefully calculated longitudinal apertures along the critical interconnect lines. This suggested method is appropriate for selected critical interconnect wires, since its application is more practical during the layout design stage. Such critical interconnect lines are also the best candidates to be designed and modelled as transmission lines (see U.S. Pat. No. 7,454,733 for "An Interconnect-Aware Methodology for Integrated Circuit Design", and U.S. Pat. No. 7,080,640 for "Interconnect-Aware Integrated Circuit Design"). The proposed method may be provided as an integral part of the on-chip transmission line layout generation stage.

BRIEF DESCRIPTION OF THE DRAWINGS

The subject matter regarded as the invention is particularly pointed out and distinctly claimed in the concluding portion of the specification. The invention, both as to organization and method of operation, together with objects, features, and advantages thereof, may best be understood by reference to the following detailed description when read with the accompanying drawings in which:

FIG. 3 is a flow diagram of a method in accordance with the present invention;

FIG. 4 is a flow diagram of an algorithm for selecting the number of elongated apertures in an interconnect line in accordance with an aspect of the present invention;

Figure 1:
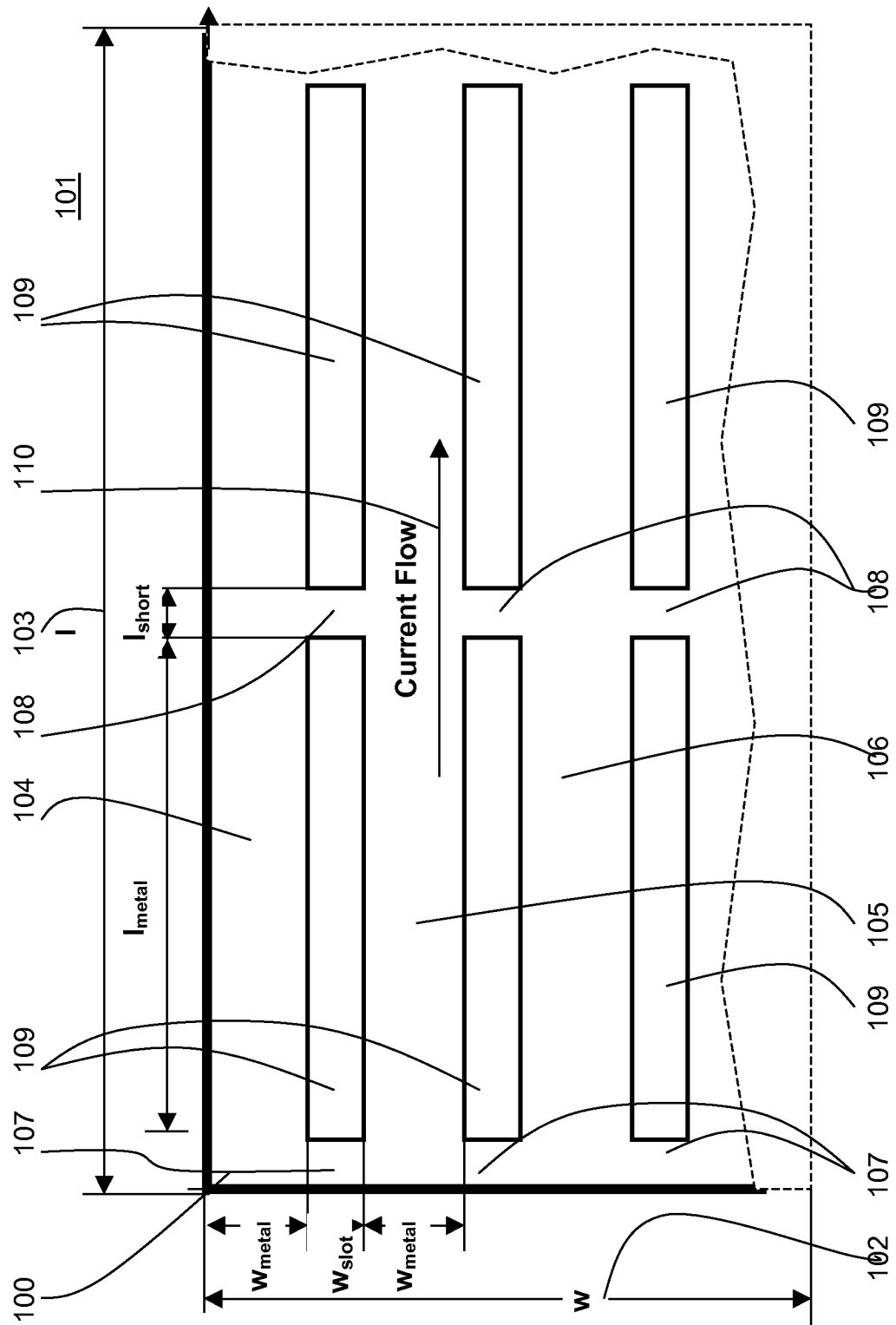
FIG. 1 is a plan of an interconnect line in accordance with an aspect of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DESCRIPTION OF PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

A method of determining a layout for wide wire on-chip interconnect lines is described in which the layout of the interconnect lines complies with Physical Design Rules but are also as wide as possible in order to guarantee low losses in critical interconnects.

Physical Design Rules are a series of parameters provided by semiconductor manufacturers that enable the designer to verify the correctness of a mask set. Physical Design Rules are specific to a particular semiconductor manufacturing process. A design rule set specifies certain geometric and connectivity restrictions to ensure sufficient margins to account for variability in semiconductor manufacturing processes, so as to ensure that most of the parts work correctly.

The most basic design rules include single layer rules. A width rule specifies the minimum and maximum width of any shape in the design. A spacing rule specifies the minimum distance between two adjacent objects. These rules will exist for each layer of a semiconductor manufacturing process, with the lowest layers having the smallest rules and the highest metal layers having larger rules.

Referring to FIG. 1, an example embodiment of an interconnect line 100 is provided supported in an insulating dielectric surrounding material 101. The interconnect line 100 may be a critical on-chip copper interconnect line which may be modelled as a transmission line. The interconnect line 100 may be implemented in SiGe/BiCMOS/RFCMOS or standard CMOS process technology and may be a transmission line such as a "microstrip line", "coplanar waveguide", etc.

In the described method, if an interconnect line has a wire design width w greater than the maximum width, $W_{max}$, defined by the Physical Design Rules, the wire is slotted as described below. Each layer of the interconnect line has slots of a determined width and spacing according to the given technology BEOL (back end of the line). BEOL is the portion of the integrated circuit fabrication line where the active components are interconnected with wiring on a wafer. Layers of metal are deposited on the wafer, with each layer having different parameters determining the slot layout.

The interconnect line 100 has a width 102 and a length 103. The interconnect line 100 may be split into a plurality of fingers or strips 104, 105, 106 across the width 102 of the interconnect line 100. The fingers 104, 105, 106 may extend the length 103 of the interconnect line 100. The fingers 104, 105, 106 may be connected at intervals along the length 103 of the interconnect line 100 by shorts or bridges 107, 108. The shorts 107, 108 may maintain the same potential between the different fingers 104, 105, 106 of the interconnect line 100. The fingers 104, 105, 106 may be defined by longitudinal apertures or slots 109 in the interconnect line 100 which may be filled with the dielectric material 101.

The interconnect line 100 is defined as having a width 102 "w" and length 103 "l". The fingers 104, 105, 106 are defined as each of width "$W_{metal}$" and the slots 109 are defined as each of width "$W_{slot}$". The length of the slots 109 is defined as length "$l_{metal}$". The shorts 107, 108 are defined with a width "$l_{short}$".

The direction of current flow 110 along the interconnect line 100 is shown. The current flows 110 along each of the fingers 104, 105, 106 and therefore, the path of the current is equal in length to the interconnect line length "l" 103 as the current can flow straight along the fingers 104, 105, 106.

It has been found that an optimum interval "$l_{metal}$" between the shorts 107, 108 is no more than a tenth of the shortest signal wavelength. The spacing has a relationship to the speed of the signal, so the highest speed signal is used. In practice, a spacing of approximately 50 μm is used.

The choice of the number of slots, the width and the spacing may be determined for each layer of the interconnect line. The method of determining the layout is described further below.

Slotting Algorithm for Wide Wires

If a wire design width w is greater than $W_{max}$ defined by Physical Design Rules, the wire is slotted by being divided into sub-wires or fingers of equal width $W_{metal}$ by slots of equal width $W_{slot}$.

In addition to joining the sub-wires at the wire ends, it is recommended also to join them every 50 μm by narrow bridges (for example, by a bridge of width according to the Physical Design Rules minimum width).

The number of slots may be defined as follows:

$$\text{if } w \leq W_{max}, N_{slots}=0;$$

$$\text{if } w > W_{max}, N_{slots}=\text{floor}((w-W_{low})/(W_{slot}+W_{low}))$$

where $$W_{low}=K_{slot}*(W_{max}-W_{slot})$$

Wherein $W_{low}$ is the minimal value of a sub-wire width $W_{metal}$. In order to define the proposed algorithm for a given BEOL, two parameters may be chosen: $W_{slot}$ (the width of the slots) and $K_{slot}$, wherein $K_{slot}<1$ is a factor which defines the "onset of slotting".

The proposed algorithm assumes constant values of $W_{slot}$ and $K_{slot}$, i.e. chosen independently of wire width w, and optimized per layer for a given technology BEOL. Therefore, $W_{low}$ is also constant per layer.

The resulting width of each sub-wire is a function of the wire width and the number of slots:

$$W_{metal}=(w-N_{slots}*W_{slot})/(N_{slots}+1).$$

Reasoning for the Slotting Parameters Choice

The parameters of a suggested slotting algorithm may be chosen in such a way that the resulting slotted wire has the maximal metal density, while satisfying the following conditions.

1. Design Rule Check $W_{metal}$ should be no less than DRC minimum width for a respective layer, which yields:

$$W_{low} \geq W_{DRCmin}$$

2. Optical Proximity Correction

For slotted wires located in metal layers subject to optical proximity correction (OPC), it is required that OPC=0 for any computed $W_{metal}$. To achieve this, $W_{metal}$ should be greater than the minimal wire width for which OPC=0, yielding:

$$W_{low} \geq \min(W|OPC(W)=0).$$

Optical proximity correction (OPC) is a photolithography enhancement technique commonly used to compensate for image errors due to diffraction or process effects. The need for OPC is due to the limitations of light to maintain the edge placement integrity of the original design, after processing, into the etched image on the silicon wafer. These projected images appear with irregularities such as line widths that are narrower or wider than designed, these can be compensated for by changing the pattern on the photomask used for imaging. Other distortions such as rounded corners are driven by the resolution of the optical imaging tool and are harder to compensate for. Such distortions, if not corrected for, may significantly alter the electrical properties of what was being fabricated.

Optical Proximity Correction corrects these errors by moving edges or adding extra polygons to the pattern written on the photomask. OPC has a cost impact on photomask fabrication whereby the mask write time is related to the complexity of the mask and data-files. Therefore, it is advantageous that OPC=0 for $W_{metal}$.

3. Physical Design Rules

The chosen values $W_{metal}$ and $W_{slot}$ should comply with the Physical Design Rules for a respective layer, namely:

$$\text{for } W_{metal} \geq W_i, W_{slot} \geq S_i, i=1\ldots n, \text{ where } W_i, S_i \text{ increase with } i.$$

It should be noted that OPC is applied to very thin wires, which are narrower than $W_n$.

The multiple rules 1 . . . n are defined for a layer, so i is the specific rule number. These rules define minimal space between wires of certain width w1 and w2 in a stepwise manner.

For example (the numbers are for illustration only, not real-life ones), if the minimal and maximal wire width for a chosen layer are 0.5 μm and 15 μm respectively, then the Rules set for this layer may look like:

(i=1) minimal wire width=0.5 μm; minimal space=1 μm;
(i=2) for 1 μm<w1, w2≤3 μm, space should be >1.5 μm;
(i=3) for 3 μm<w1, w2≤7 μm, space should be >3 μm;
(i=n=4) for w1, w2>7 μm, space should be >5 μm;

Based on these Rules, the slotting parameters may be chosen as follows:

$$W_{slot}=S_n=5 \text{ μm},$$

$$K_{slot}=W_n/(W_{max}-S_n)=7 \text{ μm}/(15 \text{ μm}-5 \text{ μm})=0.7.$$

Using the example above, assume that OPC in the chosen layer is defined for wire widths narrower than 0.8 μm. Then, for this layer, fingers may be chosen a width no less than 0.8 μm.

4. Metal Density Rule

For wide slotted wires, the metal density should comply with the Metal Density Rules.

The metal density D is checked with a tiling by a relatively large square of specified size $W_{tile}$, which yields:

$$D_{min} \leq D \leq D_{max} \text{ for } w \geq W_{tile}$$

The metal density of a slotted wire can be defined as $$D=1-W_{slot}*(N_{slots}+2)/(w+2*W_{slot}),$$

where $W_{slot}$=const.

The metal density definition above considers the spaces on both sides of the slotted wire which should be at least of width $W_{slot}$.

For each fixed value of $N_{slots}=N$, the wire width values w which will receive this number of slots cover the range:

$$W_{low}+N*(W_{slot}+W_{low})=W_{Nmin} \leq w < W_{Nmax}=W_{low}+(N+1)*(W_{slot}+W_{low}).$$

The metal density of the resulting slotted wires $$D_N=1-W_{slot}*(N+2)/(w+2*W_{slot}),$$

will increase with the increase of w from $W_{Nmin}$ $W_{Nmax}$, while remaining in the range $1-W_{slot}*(N+2)/(W_{Nmin}+2*W_{slot})=D_{Nmin} \leq D_N < D_{Nmax}=1-W_{slot}*(N+2)/(W_{Nmax}+2*W_{slot})$.

The lower boundary of $D_N$ is $$D_{Nmin}=1/(1+(N+2)/(N+1)*A)$$

where $A=W_{slot}/W_{low}$.

With the increase of N, $D_{Nmin}$ monotonically increases from $1/(1+2*A)$ to $1/(1+A)$, so if $D_{Nmin} > D_{min}$ for the lower limit of $D_{Nmin}$, it will hold for all the wire width values.

The upper boundary of $D_N$ is $$D_{Nmax} = (1+1/(N+2)*A)/(1+(N+3)/(N+2)*A).$$

With the increase of N, $D_{Nmax}$ monotonically decreases from $(1+0.5*A)/(1+1.5*A)$ to $1/(1+A)$, so if $D_{Nmax} < D_n$ holds for some wire width $w=w_0$, it will also hold for any greater wire width.

The respective number of slots N can be derived from the constraint $D_{Nmax} < D_{max}$, which yields:

$$N_D > A*(D_{max}+1)/(D_{max}*(A+1)-1)-2,$$

and the range of wire widths satisfying the max density requirement is $$w > W_{low} + N_D*(W_{slot} + W_{low}) = W_{low}*(1+N_D*(A+1)).$$

SUMMARY

A simple way of defining the slotting algorithm is based on using maximal $W_n$ and $S_n$, specified in the Physical Design Rules (condition 3 above):

$$W_{slot} = S_n,$$

$$K_{slot} = W_n/(W_{max} - S_n),$$

Then, $$W_{low} = W_n.$$

Such definition ensures that:

$W_{metal}$ is greater that DRC min width (condition 1 above),
$W_{metal}$ is greater than the width values to which OPC is applied (condition 2 above),
$W_{metal}$ and $W_{slot}$ comply with the Physical Design Rules (condition 3 above).

The metal density estimation is demonstrated below using example real life values of the technology parameters.
The minimal and maximal density check tiling size is 25 µm.
The minimal allowed metal density $D_{min}=15\%$.
The maximal allowed metal density $D_{max}=80\%$.
The ratio $A = W_{slot}/W_{low} = S_n/W_n = 1/3$.
The computed lower limit of $D_{Nmin}$ is 60%, and the upper limit of $D_{Nmax}$ is 78%.
Therefore, in this case, both the minimal density and maximal density requirements are always met (condition 4 above).

Example 1

As an example, if the maximum required copper density, $M=0.8$ (80%), then $w'=4w_{slot}$. For example, in a lower level metal layer of an integrated circuit, $W_{slot}=0.2$ µm and hence $W_{metal}=0.8$ µm.

Due to the provision of slots 109, each of the fingers 104, 105, 106 may be sufficiently narrow to be less than the maximum wire width defined by Physical Design Rules.

In addition to the fingers 104, 105, 106 being as wide as possible but less than the defined maximum width, the slots 109 are preferably as narrow as possible whilst the overall copper density must be satisfied.

For example, the if an integrated circuit is manufactured with a maximum width of, for example, 1.2 µm, the choice of $W_{metal}=0.8$ µm in Example 1 above would be good.

In the Example 1, an alternative could be to use $W_{metal}=5$, $W_{slot}=1.0$ µm. This choice would improve the overall interconnect performance still providing about 83.3% copper metal density.

Example 2

Figure 2A:
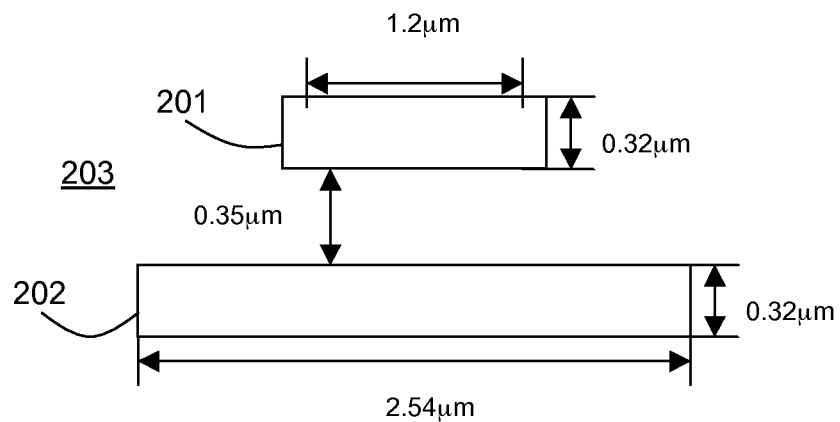
FIG. 2A is a cross-section of an on-chip transmission line with signal and ground interconnect lines as known in the prior art.
Figure 2B:
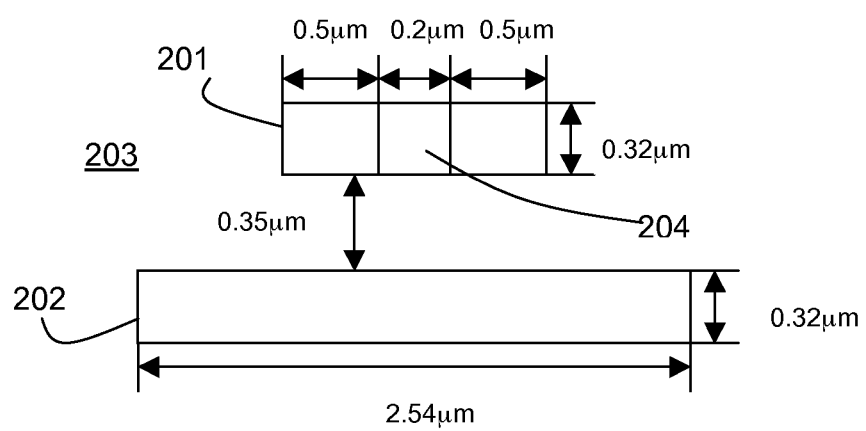
FIG. 2B is a cross-section of the on-chip transmission line of FIG. 2A with a longitudinal aperture in accordance with an aspect of the present invention.

Referring to FIGS. 2A and 2B, a single microstrip transmission line is shown. The single microstrip transmission line has no side shielding and uses two adjacent low metal levels of copper. It is assumed that the width of the signal line is greater than the allowed maximum width (in this case 1.2 µm).

FIGS. 2A and 2B show signal 201 and ground 202 metal lines in cross section as provided in an integrated circuit structure. The transmission lines 201, 202 are surrounded by an insulating dielectric material 203.

FIG. 2A shows a structure without slots and FIG. 2B shows a structure with a central slot 204.

The simulation results for the structure of FIG. 2A using capacitance and inductance extraction tools QuickCap and QuickInd (trade marks of Random Logic Corporation) as scaled for 50 µm length are as follows:
$R_{DC}=3.92$[Ohm],
$L_{DC}=14.29$[pH],
$C=11.95$[fF],
The simulation results for the structure of FIG. 2B with the central slot, are as follows:
$R_{DC}=4.45$ [Ohm] (+13.5%)→to be modelled
$L_{DC}=14.00$[pH](−2.0%)→to be ignored
$C=11.70$[fF](−2.1%)→to be ignored
The above case is the worst case since the fingers are forced to have a width of only 0.5 µm rather than 1.0 µm for wide lines.

This shows that capacitance and inductance (both high and low frequency limits) for the slotted structure of FIG. 2B can be assumed to be practically equal to their values for the one-piece copper line of width w of FIG. 2A.

Referring to FIG. 3, a flow diagram 300 shows an embodiment of the described method. An interconnect line width may be provided 301 as required for a given layer technology. It is determined 302 if the width is greater than a maximum allowed width for the layer, for example, according to the Physical Design Rules for a layer technology. If the width is not greater than the allowed maximum, the method proceeds 303 with a line with no slots.

If the width is greater than a maximum allowed width for the layer, parameters of $W_{slot}$ and $K_{slot}$ may be selected 304 for the layer technology. The parameters may be selected to meet the conditions described above. In one embodiment, the parameter of $W_{slot}$ is selected per layer as the minimum slot width $S_n$ which complies with the Design Rules for any wire width in a selected metal layer (and is therefore the largest minimum slot width), and $K_{slot}$ is selected as $K_{slot}=W_n/(W_{max}-S_n)$ where $W_n$ is the minimum finger width for which the Design Rules require space no less than $S_n$ Once the parameters are selected, the required number of slots in the interconnect may be determined 305. The width of the fingers may also be determined 306.

The length of the slots along the interconnect line may be determined 307 and the width of the bridges provided longitudinally between the slots may also be determined 308.

The layout of the slotted interconnect line is then determined 309 with slotting to provide two or more fingers extending along the interconnect line with an elongate slot separating adjacent fingers;

The suggested slotting algorithm by width is as follows:
If, $w<W_{max}$ →do nothing (no slots)
If, $W_{low}<w<2\,W_{low}+W_{slot}$ →do one slot in the middle.
If, $2\,W_{low}+W_{slot}<w<3\,W_{low}+2\,W_{slot}$ →do two slots in a symmetrical manner.
This gives:

$$i = \text{number of slots}$$
$$= \left[\frac{w - W_{low}}{W_{slot} + W_{low}}\right]$$
$$= \text{round}\left[0.5 + \left(\frac{w - W_{low}}{W_{slot} + W_{low}}\right)\right]$$

(where || denotes the high integer value)

$$W_{mental} = \left(\frac{w - iW_{slot}}{i+1}\right)$$

and the calculated resistance of the line will be:

$$R = R_0\left(\frac{\text{length}}{w_{eff}}\right)$$
$$w_{eff} = (i+1)W_{mental} = w - iW_{slot}$$

$R_0$ is the copper layer sheet resistivity.
Generation of Shorts Along the Length of the Line
l is the total length of the transmission line.
$L_{metal}<l_0$, the length of a slot is less than the maximal slot length, which could be kept to $l_0=100\,\mu m$ for all technologies. $l_{short}$ is the minimal DRC (Design Rule Check) width allowed. (For example, a minimal width may be 0.14 μm.)
The suggested slotting algorithm by length is as follows:
If, $l<l_0+2\,l_{short}$ →no shorts in the middle. (In this case, maintain whole slots along the whole transmission line except the two shorts at each end.)
If, $l_0+2\,l_{short}<l<2l_0+3\,l_{short}$ →do additional one short in the middle of the transmission line.
If, $2l_0+3\,l_{short}<l<3l_0+4l_{short}$ →have two shorts in the middle in a symmetrical manner.
This gives:

$$j = \text{number of shorts, including the two at each end}$$
$$= 1 + \left|\frac{l - l_{short}}{l_0 + l_{short}}\right|$$
$$= 1 + \text{round}\left[\frac{l - l_{short}}{l_0 + l_{short}} + 0.5\right]$$
$$l_{metal} = \left(\frac{l - jl_{short}}{j-1}\right)$$

The slotting is therefore defined by the two parameters of i and j while maintaining symmetry.

Referring to FIG. 4, an algorithm 400 is shown for choosing the number of slots across the width of an interconnect line.

At step 401, it is determined if any slots are needed in the interconnect line. One or more slots are only required if the width w of the interconnect line is greater than the threshold $W_{max}$. Therefore, if it is determined that the width w is sufficiently small, then no slots are needed 402.

If the width w is greater than the threshold $W_{max}$, it is then determined 403 if one slot is appropriate. This is determined by calculating if the width w is less than the sum of two fingers having slotting onset threshold widths $W_{low}$ and a minimum slot width $W_{slot}$. If it is determined that the width w falls within this range 403, then one slot is provided 404.

If the width w is greater than the sum defined as the top end of the range at step 403, then the algorithm proceeds incrementing the number of slots needed. It is determined as shown at step 405, if the width w is in the range for i slots of:

$$iW_{low}+(i-1)W_{slot}<w<(i+1)W_{low}+iW_{slot}$$

If w is in this range, i slots are provided 406 in a symmetrical manner in the interconnect line.

Figure 5:
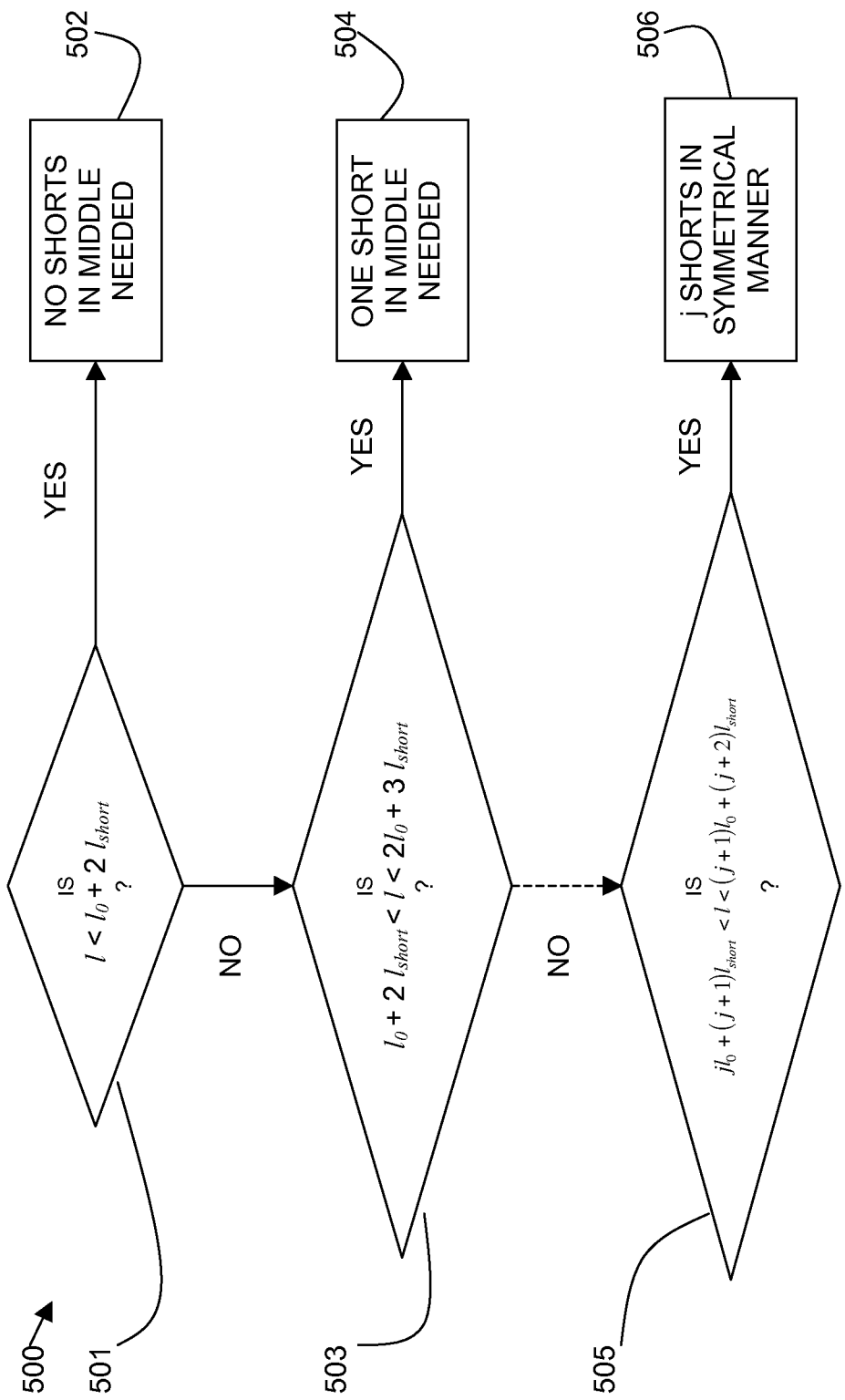
FIG. 5 is a flow diagram of an algorithm for selecting the number of shorts along a length of an elongated aperture in an interconnect line in accordance with an aspect of the present invention.

Referring to FIG. 5, an algorithm 500 is shown for choosing the number of shorts along the length of an interconnect line.

At step 501, it is determined if any bridges or shorts are needed in the middle of slots along the length of the interconnect line. Two shorts are provided at either end of a slot and additional shorts are required if the length l of the interconnect line is greater than a maximal slot length, $l_0$. Therefore, at step 501 it is determined if the line length is less than the maximal slot length $l_0$ plus the widths of the two shorts at each end, $2l_{short}$. If so, then no shorts are needed 502 in the middle of the slot.

If the line length l is greater than the threshold defined in step 501, it is then determined 503 if one short is appropriate in the middle of the slot. This is determined by calculating if the line length l is less than the sum of two maximal slot lengths $2l_0$ plus three widths of shorts (one at each end and one in the middle) $3\,l_{short}$. If it is determined that the line length l falls within this range 303, then one short is provided 504.

If the line length l is greater than the sum defined as the top end of the range at step 503, then the algorithm proceeds incrementing the number of shorts needed. It is determined as shown at step 505, if the line length is in the range for j slots of:

$$jl_0+(j+1)l_{short}<l<(j+1)l_0+(j+2)l_{short}$$

If the line length l is in this range, j shorts are provided 506 in a symmetrical manner along the interconnect line.

Figure 6:
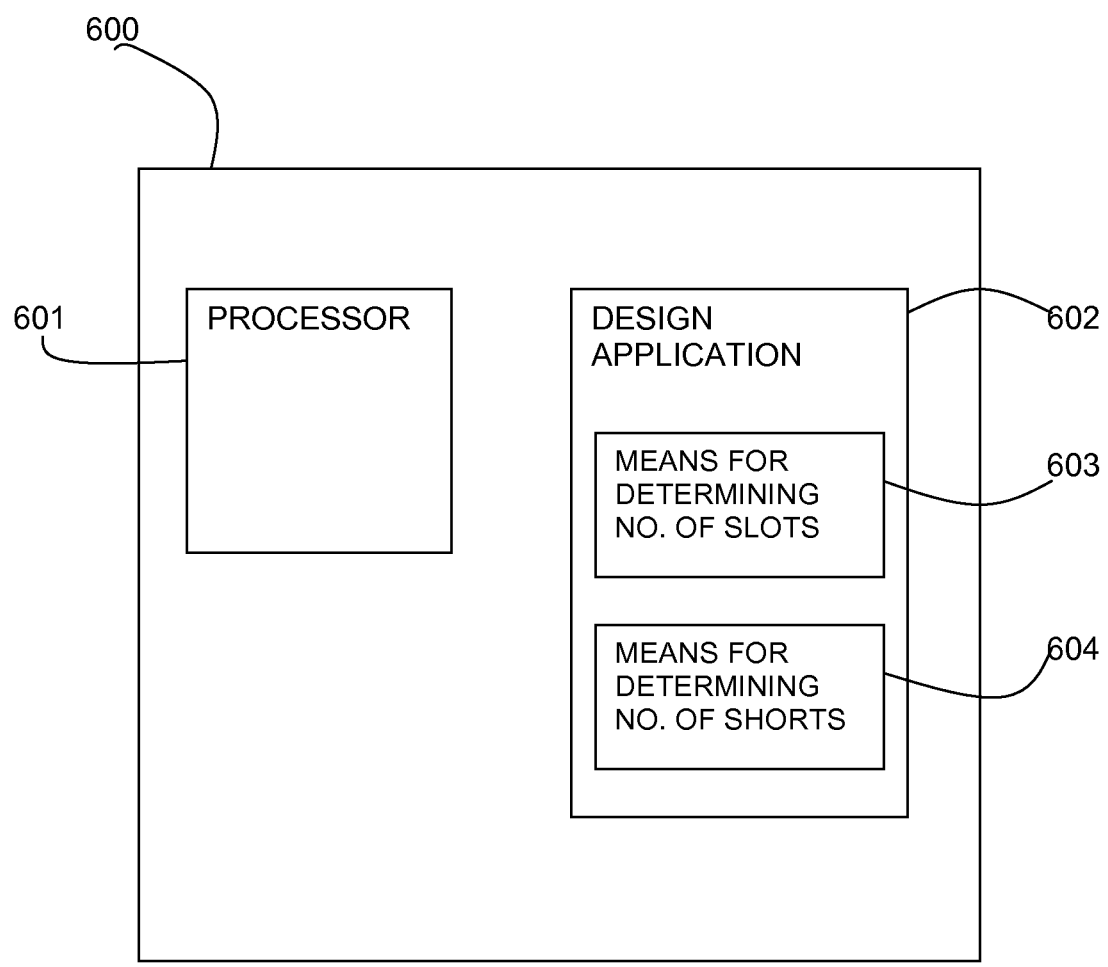
FIG. 6 is a block diagram of a computer system with design tools in accordance with an aspect of the present invention.

Referring to FIG. 6, a computer system 600 is shown schematically with a processor means 601. A computer software application 602 is provided for the design of the layout of integrated circuits. The application 602 includes software tools for determining the from of a critical interconnect line including means 603 for determining the number of elongate apertures to be arranged across the width of the line and means 604 for determining the number of bridges or shorts required along the length of the line.

Figure 7:
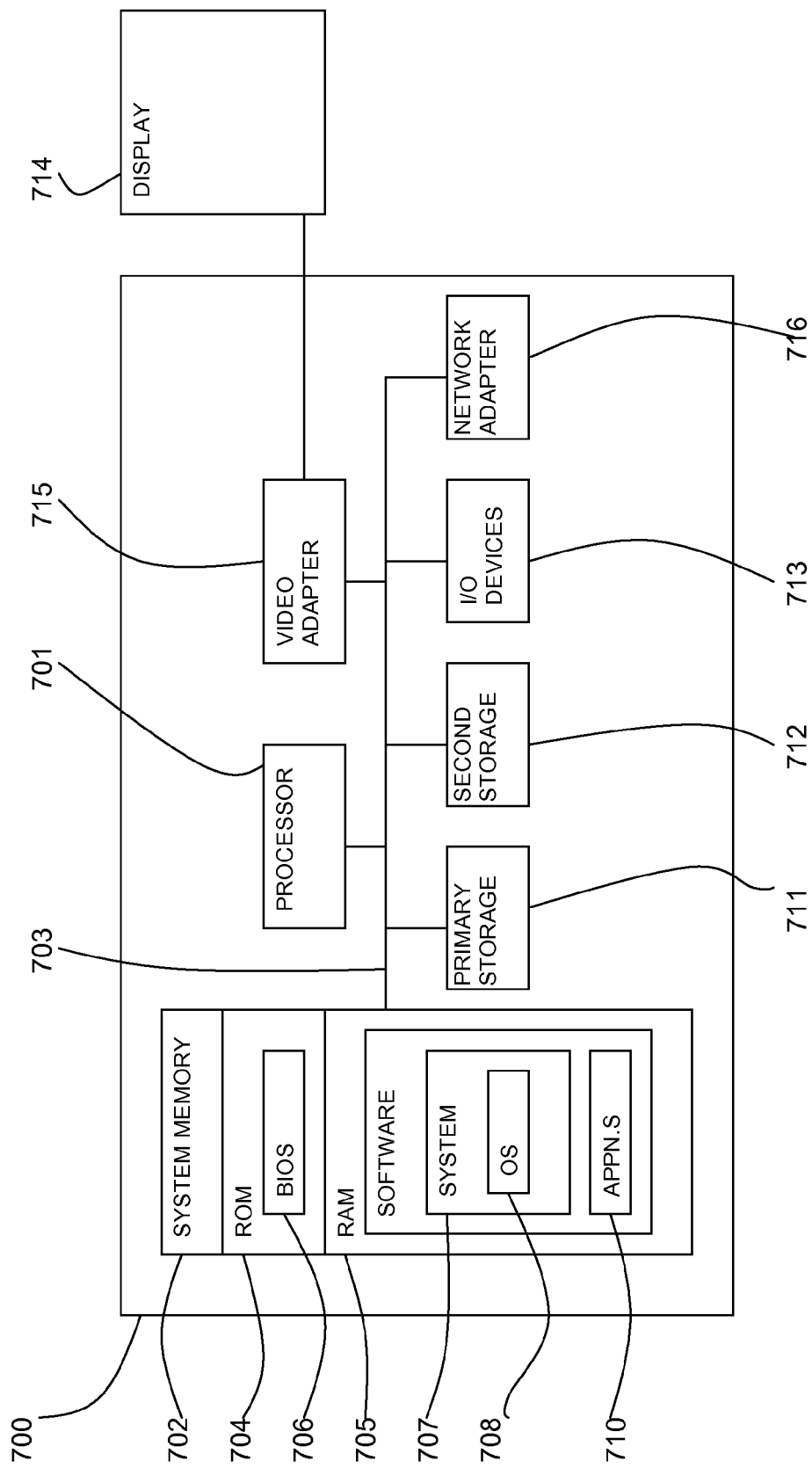
FIG. 7 is a block diagram of a computer system in which the present invention may be implemented.

Referring to FIG. 7, an exemplary system for implementing aspects of the invention includes a data processing system 700 suitable for storing and/or executing program code including at least one processor 701 coupled directly or indirectly to memory elements through a bus system 703. The memory elements can include local memory employed during actual execution of the program code, bulk storage, and cache memories which provide temporary storage of at least some program code in order to reduce the number of times code must be retrieved from bulk storage during execution.

The memory elements may include system memory 702 in the form of read only memory (ROM) 704 and random access memory (RAM) 705. A basic input/output system (BIOS) 706 may be stored in ROM 704. System software 707 may be stored in RAM 705 including operating system software 708. Software applications 710 may also be stored in RAM 705.

The system 700 may also include a primary storage means 711 such as a magnetic hard disk drive and secondary storage means 712 such as a magnetic disc drive and an optical disc drive. The drives and their associated computer-readable media provide non-volatile storage of computer-executable instructions, data structures, program modules and other data for the system 700. Software applications may be stored on the primary and secondary storage means 711, 712 as well as the system memory 702.

The computing system 700 may operate in a networked environment using logical connections to one or more remote computers via a network adapter 716.

Input/output devices 713 can be coupled to the system either directly or through intervening I/O controllers. A user may enter commands and information into the system 700 through input devices such as a keyboard, pointing device, or other input devices (for example, microphone, joy stick, game pad, satellite dish, scanner, or the like). Output devices may include speakers, printers, etc. A display device 714 is also connected to system bus 703 via an interface, such as video adapter 715.

The splitting of copper interconnect lines into connected fingers can be carried out as an integral part of an interconnect device parametric cell (Pcell), which creates an instance with newly proposed hole-shapes automatically in a layout view once dimensions and metal layers are specified. One of the preferable requirements is to maintain, where possible, symmetry with respect to conductor centre hole pattern distribution.

The change in transmission line electrical parameters due to elongate apertures present is programmed in a transmission line parametric model, which can be used for time and frequency domain simulations.

The described method allows for copper signal lines to be manufactured with widths larger than current limits for transmission line interconnects.

The finger patterns are uniquely defined for a given copper interconnect line (signal or ground), which means that there is no random character in an interconnect line's properties and behaviour.

When determining the structure of a transmission line, the current direction is known in advance. This enables the arrangement of the slots to be determined in order to minimize current flow disturbance as well as enabling the dishing of wide copper lines to be avoided.

The low frequency resistance of an interconnect line with slots provided in it is trivial to estimate. It is simply the resistance of a set of one-piece rectangular fingers connected in parallel and in series. This can be easily implemented in transmission line models.

The other high frequency transmission line electrical parameters are more easily calculated due to the 2D nature of the described approach compared to the 3D nature of the existing hole-generation process. Therefore, a transmission line can be almost defined by its 2D nature when the length is larger than width, even if this not so, a uniform current can still be assumed in the direction of an interconnect line.

For the described structure, the current length flow is equal to an interconnect line length. For the "isotropic" hole-generation method, the effective current path is always greater than the interconnect length. This causes, for instance, an additional interconnect resistance degradation, which is difficult to predict. In addition, in the described structure the direction of the current is known as it is along long edges of the rectangular slots.

Also there is no periodic interference with the described slotted structure. The finger shorting every predetermined length of slot has a negligible effect. While in the standard hole-generation approach, there is scattering from the periodic holes at the very high frequencies. This may be important in some high end microwave design applications.

When the width of the fingers is much greater than the width of the slots, the effect of the described method on most (but not all) transmission line parameters at high frequencies can be ignored and the structure can be simply assumed to be a one-piece, whole copper line. The only correction is for the resistance. This has been verified using 2D and 3D EM solver simulations in comparison with the existing hole-generation process effects which are much more severe.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

We claim:

1. A method of determining a layout of an interconnect line to minimize dishing of wide copper metallization in an integrated circuit, comprising:

having a required width for the interconnect line;

determining a number $N_{slots}$ of elongate apertures to be arranged across the width of the interconnect line as the largest integer not greater than $((w-W_{low})/(W_{slot}+W_{low}))$ where $W_{low}=K_{slot}*(Wmax-Wslot)$, wherein w is the width of the interconnect line, $W_{low}$ is a minimal value of a finger width, $W_{slot}$ is a width of slots, $W_{max}$ is a maximum threshold width of the interconnect line, and $K_{slot}$ is a factor of less than 1 which defines an onset of slotting;

determining a number of shorts placed along a length of said interconnect line as a function of a maximal elongate aperture length, wherein if the length of said interconnect line exceeds a threshold multiple shorts are placed along said interconnect line in a symmetrical manner; and wherein said steps are implemented in either:

computer hardware configured to perform said providing and determining steps, or computer software embodied in a non-transitory, tangible, computer-readable storage medium.

2. The method as claimed in claim 1, wherein determining the layout of the interconnect line comprises slotting the interconnect line to provide two or more fingers extending along the interconnect line with an elongate slot separating adjacent fingers.

3. The method as claimed in claim 1, including providing a required width for the interconnect line greater than a maximum threshold width for a given layer technology.

4. The method as claimed in claim 1, wherein the method includes ensuring that a density of a metal of the interconnect line falls within a predetermined range.

5. The method as claimed in claim 1, wherein the method includes arranging the elongate apertures symmetrically across the width of the interconnect line.

6. The method as claimed in claim 1, including:

selecting a number of fingers and the width of the slots to optimize the layout for a given layer technology.

7. The method as claimed in claim 1, wherein the maximum threshold width $W_{max}$ for a given layer technology is specified by Physical Design Rules for the layer technology.

8. The method as claimed in claim 1, including:

selecting parameters of the slot width $W_{slot}$, and a factor $K_{slot}$ of less than 1 which defines the onset of slotting which are constant for a given layer technology, independent of the width of the interconnect line.

9. The method as claimed in claim 8, including:

selecting a value for the parameter of slot width $W_{slot}$ as a minimum slot width $S_n$ which complies with Physical Design Rules for any wire width in a selected metal layer and is therefore a largest minimum slot width; and selecting a value for the parameter $K_{slot}$ for the onset of slotting as $K_{slot}=W_n/(Wmax-Sn)$ where $W_n$ is a minimum finger width for which the Physical Design Rules require space no less than $S_n$, and $W_{max}$ is the maximum threshold width of the interconnect line.

10. The method as claimed in claim 8, wherein the parameters are chosen so that a resultant slotted interconnect line has a maximal metal density whilst complying with other predefined conditions.

11. The method as claimed in claim 10, wherein the other predefined conditions comprise a predefined condition indicating that a width of the fingers is no less than a minimum width for the layer technology as specified by Physical Design Rules for the layer technology.

12. The method as claimed in claim 10, wherein the other predefined conditions comprise a predefined condition indicating that a width of the fingers does not require optical proximity correction.

13. The method as claimed in claim 10, wherein the other predefined conditions comprise a predefined condition indicating that a width of the fingers and the width of the slots comply with Physical Design Rules for a layer technology.

14. The method as claimed in claim 10, wherein the other predefined conditions comprise a predefined condition indicating that the metal density complies with Metal Density Rules.

15. The method as claimed in claim 10, wherein the layer technology is a back end of line technology.

16. The method as claimed in claim 1, wherein the method also includes:
having a required length for the interconnect line; and
determining a number of bridges to be arranged along an elongate aperture by comparing the required length to a maximum elongate aperture length and a minimum width of bridge.

17. The method as claimed in claim 16, wherein the maximum elongate aperture length is less than a tenth of a shortest wavelength to be carried along the interconnect line.

18. The method as claimed in claim 1, wherein the method includes placing a bridge at each end of the interconnect line and symmetrically spacing any additional bridges along an elongate aperture.

19. A computer program product for determining a layout of an interconnect line to minimize dishing of wide copper metallization in an integrated circuit, the computer program product comprising:

a computer readable storage medium having computer readable program code embodied therewith, the computer readable program code comprising:

computer readable program code configured to:

receive a required width for an interconnect line;

determine a number $N_{slots}$ of elongate apertures to be arranged across the width of the interconnect line as the largest integer not greater than $((w-W_{low})/(W_{slot}+W_{low}))$ where $W_{low}=K_{slot}*(W_{max}-W_{slot})$, wherein w is the width of the interconnect line, $W_{low}$ is a minimal value of a finger width, $W_{slot}$ is s a width of slots, Wmax is a maximum threshold width of the interconnect line, and $K_{slot}$ is a factor of less than 1 which defines an onset of slotting; and determine a number of shorts placed along a length of said interconnect line as a function of a maximal elongate aperture length, wherein if the length of said interconnect line exceeds a threshold multiple shorts are placed along said interconnect line in a symmetrical manner.

* * * * *